United States Patent
Kim et al.

(10) Patent No.: US 10,608,667 B2
(45) Date of Patent: Mar. 31, 2020

(54) METHOD OF LOW COMPLEXITY SCL DECODING FOR POLAR CODES AND APPARATUS THEREOF

(71) Applicant: RESEARCH & BUSINESS FOUNDATION SUNGKYUNKWAN UNIVERSITY, Suwon-si (KR)

(72) Inventors: Sang Hyo Kim, Seongnam-si (KR); Jong Hwan Kim, Suwon-si (KR); Yeon Joon Choi, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 2 days.

(21) Appl. No.: 15/907,365

(22) Filed: Feb. 28, 2018

(65) Prior Publication Data
US 2018/0248564 A1    Aug. 30, 2018

(30) Foreign Application Priority Data

Feb. 28, 2017    (KR) .................. 10-2017-0026661
Apr. 21, 2017    (KR) .................. 10-2017-0051744

(51) Int. Cl.
*H03M 13/13*    (2006.01)
*H03M 13/15*    (2006.01)
(Continued)

(52) U.S. Cl.
CPC .......... *H03M 13/13* (2013.01); *H03M 13/09* (2013.01); *H03M 13/1575* (2013.01);
(Continued)

(58) Field of Classification Search
CPC .. H03M 13/09; H03M 13/13; H03M 13/1575; H03M 13/451; H03M 13/2906;
(Continued)

(56) References Cited

U.S. PATENT DOCUMENTS

2014/0019820 A1*  1/2014  Vardy .................. H03M 13/13
                                                              714/752
2014/0173376 A1    6/2014  Jeong et al.
(Continued)

FOREIGN PATENT DOCUMENTS

KR    10-2014-0077492 A    6/2014
KR    10-2014-0077596 A    6/2014
(Continued)

OTHER PUBLICATIONS

Yuan et al., Low latency successive cancellation list decoders for Polar codes with multiple decision, IEEE Trans on very large scale integration systems vol. 23, No. 10, pp. 1168 to 2280. (Year: 2015).*
(Continued)

*Primary Examiner* — Shelly A Chase
(74) *Attorney, Agent, or Firm* — NSIP Law

(57) ABSTRACT

A method of low complexity SCL decoding for polar codes is disclosed. The method comprises receiving a codeword vector generated using polar encoding, and sequentially decoding multiple bits included in a source vector from the received codeword vector based on the successive cancellation list (SCL) decoding, wherein the decoding is configured not to perform a comparison of reliability between candidate decoding paths for a subset of information bits included in the source vector, but to determine value of the subset of information bits based on a reliability of the corresponding bit.

18 Claims, 8 Drawing Sheets

(51) Int. Cl.
*H03M 13/00* (2006.01)
*H03M 13/09* (2006.01)
*H03M 13/29* (2006.01)

(52) U.S. Cl.
CPC ... *H03M 13/2906* (2013.01); *H03M 13/6362* (2013.01); *H03M 13/616* (2013.01)

(58) Field of Classification Search
CPC .......... H03M 13/6362; H03M 13/616; H03M 13/45; H03M 13/6502
See application file for complete search history.

(56) References Cited

U.S. PATENT DOCUMENTS

| | | |
|---|---|---|
| 2015/0263767 A1 | 9/2015 | Shin et al. |
| 2015/0333769 A1 | 11/2015 | Jeong et al. |
| 2017/0230141 A1 | 8/2017 | Jeong et al. |

FOREIGN PATENT DOCUMENTS

| | | |
|---|---|---|
| KR | 10-2015-0106270 A | 9/2015 |
| KR | 10-2015-0131540 A | 11/2015 |

OTHER PUBLICATIONS

Stimming et al., LLR-based successive cancellation list decoding of Polar codes, IEEE Trans. on signal processing, pp. 5165 to 5179. (Year: 2015).*

Fan et al., A Low latency list successive cancellation decoding implementation for Polar codes, IEEE Journal on selected areas in communications, vol. 34, No. 2, pp. 303 to 317. (Year: 2016).*

Korean Office Action dated Apr. 19, 2018 in corresponding Korean Patent Application No. 10-2017-0051744 (5 pages in Korean).

Arikan, Erdal. "Channel polarization: A method for constructing capacity-achieving codes for symmetric binary-input memoryless channels." *IEEE Transactions on Information Theory*, vol. 55, No. 7, Jul. 2009, pp. 3051-3073.

Ido Tal, et al., "List Decoding of Polar Codes," *IEEE Transactions of Information Theory*, vol. 61, No. 5, May 2015, pp. 2213-2226.

* cited by examiner

---

METHOD OF LOW COMPLEXITY SCL DECODING FOR POLAR CODES AND APPARATUS THEREOF

CROSS-REFERENCE TO RELATED APPLICATIONS

This application claims priority to Korean Patent Applications No. 10-2017-0026661 filed on 28 Feb. 2017 and No. 10-2017-0051744 filed on 21 Apr. 2017 in Korea, the entire contents of which are hereby incorporated by reference in their entirety.

BACKGROUND

1. Technical Field

The present disclosure relates to methods for decoding a polar code, and more specifically to methods and an apparatuses for decoding a polar code with a low complexity.

2. Description of Related Art

The channel code is used for error correction in data transmission over a noisy communication channel. Transmission of redundancy bits with the data to be transmitted allows error correction.

One of the channel codes, polar code, is the first channel code to achieve point-to-point channel capacity with low encoding/decoding complexity using channel polarization. The polar code, developed by Arikan in 2009, has been actively researched and developed to date and has excellent error performance. Thus, in recent years, the polar code has been adopted as one of the 3rd Generation Partnership Project (3GPP) 5G channel codes. However, polar codes have weaknesses in comparison with other channel codes in that the polar codes have high decoding complexity.

SUMMARY

A purpose of the embodiments of the present disclosure for solving the above problem is to provide a SCL decoding method of polar codes with low complexity, whereby improving the conventional polar code decoding algorithm, it is possible to reduce the power consumption resulting from the computing amount reduction of the actual polar code decoder, and additionally, depending on the decoder implementation method, decoding throughput can also be increased.

Another purpose of the embodiments of the present disclosure for solving the above problem is to provide a SCL decoding device of polar codes with low complexity, whereby improving the conventional polar code decoding algorithm, it is possible to reduce the power consumption resulting from the computing amount reduction of the actual polar code decoder, and additionally, depending on the decoder implementation method, decoding throughput can also be increased.

Still another purpose of the embodiments of the present disclosure for solving the above problem is to provide a computer readable storage medium having instructions therein, which when executed by the computer, perform a SCL decoding method of polar codes with low complexity, whereby improving the conventional polar code decoding algorithm, it is possible to reduce the power consumption resulting from the computing amount reduction of the actual polar code decoder, and additionally, depending on the decoder implementation method, decoding throughput can also be increased.

However, the purposes to be achieved by the present disclosure is not limited to the foregoing, but may be variously extended without departing from the spirit and scope of the present disclosure.

In a first aspect of the present disclosure, there is provided a method of low complexity SCL decoding for polar codes, the method comprising: receiving a codeword vector generated using polar encoding; and sequentially decoding multiple bits included in a source vector from the received codeword vector based on the successive cancellation list (SCL) decoding, wherein the decoding is configured not to perform a comparison of reliability between candidate decoding paths for at least one partial bit among information bits included in the source vector, but to determine value of the partial bits based on a reliability of the corresponding bit.

In one embodiment of the first aspect, the source vector includes the information bits and frozen bits, wherein the partial bits includes bits corresponding to an indexes belonging to a subset of an information set, which is a set of an indexes corresponding to the information bits.

In one embodiment of the first aspect, the decoding includes sequential processing of each of multiple bits included in the source vector, wherein the sequential processing includes one of: maintaining a number of candidate decoding paths by assigning a predefined bit value to a current bit in response to a determination that the current bit is the frozen bits; maintaining a number of candidate decoding paths via independently determining a value of the current bit by each candidate decoding path based on a reliability of the current bit in response to a determination that the current bit is the partial bits; and increasing a number of candidate decoding paths according to candidate values of the current bit in response to a determination that the current bit is the information bit not belonging to the partial bits.

In one embodiment of the first aspect, the increasing a number of candidate decoding paths further comprises: removing candidate decoding paths exceeding the maximum number of paths, in response to a determination that the increased number of candidate decoding paths exceeds a predetermined maximum number of paths, by sorting the candidate decoding paths based on reliability of each of candidate decoding paths In one embodiment of the first aspect, the decoding further comprises, after processing of a final bit among multiple bits included in the source vector is completed, completing the decoding of multiple bits included in the source vector by selecting a decoding path having a highest reliability among the candidate decoding paths.

In one embodiment of the first aspect, the source vector is a source vector to which at least one of a cyclic redundancy check (CRC) code or a parity-check code is pre-applied.

In one embodiment of the first aspect, the partial bits includes bits determined to have a predetermined high-ranked reliability among the information bits, based on the reliability of the information bits.

In one embodiment of the first aspect, a size of the partial bits is configured based on at least one of the maximum number of the paths, a block length, a code rate, and a channel quality.

In one embodiment of the first aspect, the size of the partial bits is in proportion to the number of maximum paths, the block length, and the channel quality, and is inversely proportional to the code rate.

In one embodiment of the first aspect, the source vector further includes punctured bits, wherein the information bits are specified as bits other than the punctured bits among multiple bits of the source vector.

In a second aspect of the present disclosure, there is provided an apparatus of low complexity SCL decoding for polar codes, the apparatus comprising: a receiving unit configured to receiving a codeword vector generated using polar encoding; and a decoding unit configured to sequentially decoding multiple bits included in a source vector from the received codeword vector based on the successive cancellation list (SCL) decoding, wherein the decoding unit is configured not to perform a comparison of reliability between candidate decoding paths for at least one partial bit among information bits included in the source vector, but to determine value of the partial bits based on a reliability of the corresponding bit.

In one embodiment of the second aspect, the source vector includes the information bits and frozen bits, wherein the partial bits includes bits corresponding to an indexes belonging to a subset of an information set, which is a set of an indexes corresponding to the information bits.

In one embodiment of the second aspect, the decoding unit includes sequential processing of each of multiple bits included in the source vector, wherein the sequential processing is configured to perform one of: maintaining a number of candidate decoding paths by assigning a predefined bit value to a current bit in response to a determination that the current bit is the frozen bits; maintaining a number of candidate decoding paths via independently determining a value of the current bit by each candidate decoding path based on a reliability of the current bit in response to a determination that the current bit is the partial bits; and increasing a number of candidate decoding paths according to candidate values of the current bit in response to a determination that the current bit is the information bit not belonging to the partial bits.

In one embodiment of the second aspect, the increasing a number of candidate decoding paths further comprises: removing candidate decoding paths exceeding the maximum number of paths, in response to a determination that the increased number of candidate decoding paths exceeds a predetermined maximum number of paths, by sorting the candidate decoding paths based on reliability of each of candidate decoding paths In one embodiment of the second aspect, the decoding unit further comprises, after processing of a final bit among multiple bits included in the source vector is completed, completing the decoding of multiple bits included in the source vector by selecting a decoding path having a highest reliability among the candidate decoding paths.

In one embodiment of the second aspect, the source vector is a source vector to which at least one of a cyclic redundancy check (CRC) code or a parity-check code is pre-applied.

In one embodiment of the second aspect, the partial bits includes bits determined to have a predetermined high-ranked reliability among the information bits, based on the reliability of the information bits.

In one embodiment of the second aspect, a size of the partial bits is configured based on at least one of the maximum number of the paths, a block length, a code rate, and a channel quality.

In one embodiment of the second aspect, the size of the partial bits is in proportion to the number of maximum paths, the block length, and the channel quality, and is inversely proportional to the code rate.

In one embodiment of the second aspect, the source vector further includes punctured bits, wherein the information bits are specified as bits other than the punctured bits among multiple bits of the source vector.

The present invention may have the following effects. However, this does not mean that a particular embodiment must include all of the following effects or only the following effects. Accordingly, the scope of the rights of the disclosed invention should not be construed as being limited by these effects.

According to the low complexity SCL decoding method and device of the polar code according to one embodiment of the present disclosure as described above, the power consumption is reduced due to the computing amount reduction of the actual polar code decoder. Additionally, it is possible that the decoding throughput can also be increased, depending on the decoder implementation method.

More specifically, the low complexity SCL decoding scheme of the polar code according to one embodiment of the present disclosure has almost the same performance as the conventional scheme and may have performance degradation within about 0.03 dB. Further, it is confirmed that the low complexity SCL decoding scheme of the polar code according to one embodiment of the present disclosure has a complexity of about 57% in comparison with the conventional scheme.

DETAILED DESCRIPTION OF EXAMPLE EMBODIMENTS OF THE INVENTION

Figure 1:
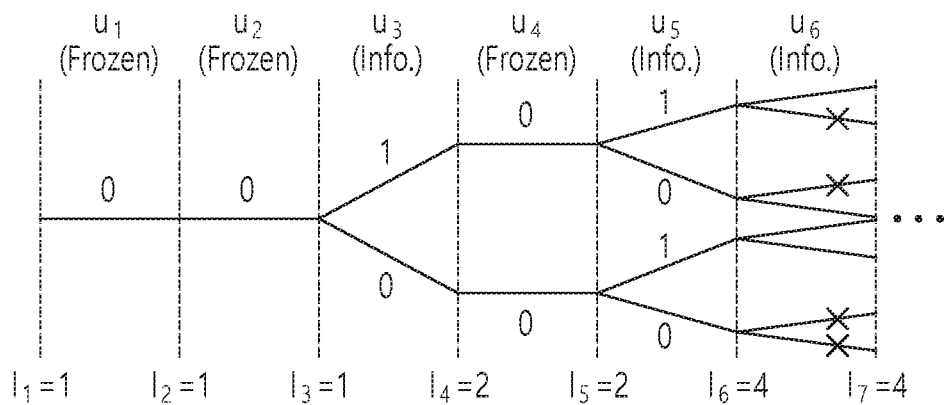
FIG. 1 shows the SCL decoding tree (L=4) for polar code decoding.

The same reference numbers in different figures denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Polar Encoding and Successive Cancellation List Decoding

The parameters needed to describe polar encoding and successive cancellation list (SCL) decoding are shown below.

N: block length
u: source vector of length 1×N composed of binary values
$G_N$: N×N sized polar encoding generator matrix defined in Non-Patent Document 1 (Arikan, "Channel polarization: A method for constructing capacity-achieving codes for symmetric binary-input memoryless channels", IEEE Trans. Inform. Theory, vol. 55, no. 7, pp. 3051-3073, July 2009.)
x: 1×N sized codeword vector composed of binary values
A: bit index set for information bits $\subset \{1, 2, \ldots, N\}$
Π: bit index set for punctured bits $\subset \{1, 2, \ldots, N\}$ The polar encoding is performed by binary multiplication between the source vector u and the generator matrix GN. The codeword vector x via the polar encoding is given by:

$$x = uG_N$$

The source vector u may be composed of information bits that the sender wants to transmit, and frozen bits. The index set of the source vectors $u_i$ corresponding to the information bits may be called the information set, which is denoted by A. The codeword vector generated via the polar encoding is received by the receiver through the channel. The decoder performs decoding of the information bits using the received vector.

There are several decoding methods for polar code decoding. As a decoding method having the best error rate performance, there is SCL decoding method. When a source vector to be finally decoded by SCL decoding is denoted as $u = (u_1, u_2, \ldots, u_N)$, the decoder sequentially decodes the source vectors $u_i$ to $u_N$ bit by bit.

FIG. 1 shows a SCL decoding tree (L=4) for polar code decoding, that is, a decoding tree for explaining the SCL decoding algorithm. The SCL decoding manages decoding paths such that while the decoding tree is extended to the right, the maximum number of decoding paths (hereinafter also referred to as a maximum path number) is maintained. In this connection, the depth of the decoding tree corresponds to the decoding of the source vector $u_i$. Eventually, after decoding all the source vector $u_i$ bits, the decoding path with the highest reliability among the L decoding paths is selected. This ends the decoding.

The SCL decoding algorithm is described in more detail below with reference to FIG. 1. In this example, a list size L=4, and an information set A={3, 5, 6, . . .}. First, the SCL decoding algorithm starts from the root $ of the decoding tree, and determines whether or not the source vector $u_1$ is an information bit. Then, SCL decoding algorithm may determine whether to expand the number of paths via generation of a branch. In FIG. 1, since the vector $u_1$ is a frozen bit, the algorithm creates one decoding path for the source vector $u_1$=0. In this connection, the bit value assigned to the frozen bit may be predetermined to be 0 or 1. In the present example, for convenience of explanation, a 0 bit value is assigned to the frozen bit. Likewise, since the source vector $u_2$ is also a frozen bit, a single decoding path is maintained. However, since the source vector $u_3$ is the information bit, the source vector $u_3$=0 or 1. Thus, the algorithm creates a branch for each case and thereby increases the number of candidate decoding paths. For convenience of explanation, for example, a lower branch is referred to as 0 and an upper branch is referred to as 1. Further, the algorithm determines whether the number of candidate decoding paths at the current stage exceeds a predetermined maximum number L of paths. If the number of candidate decoding paths does not exceed the predetermined maximum number L of paths, the number of decoding paths remains unchanged. In the example of FIG. 1, L=4 and two decoding paths are present for a depth 3, so all decoding paths proceed to the next decoding. The algorithm decodes up to source vector $u_5$ and thereby increases the number of paths to be 4. Since the next source vector $u_6$ is an information bit, the algorithm creates a branch for $u_6$=0 or 1 in each path to generate a total of eight decoding paths. However, since the maximum path number L=4, the algorithm discards four paths having the lowest reliability among the eight decoding paths. Further, the algorithm performs the next decoding using the remaining four paths with a high reliability. In this connection, to discard the four paths, the algorithm performs an operation to calculate the reliability for the eight paths and an operation to sort all the reliability. Thereafter, decoding of the remaining $u_i$ bits may be performed by repeating the operations described above, depending on whether the current bit to be decoded is an information bit. Finally, after decoding all the source vectors $u=(u_1, u_2, \ldots, u_N)$, a total of L decoding paths remain. The decoder selects the path with the highest reliability among the L decoding paths, and then ends decoding. This completes the decoding of the multiple bits of the source vectors.

Polar Encoding and Successive Cancellation List Decoding Concatenated with Outer Coding To improve the error rate performance of the polar code, outer coding may be performed before the polar encoding process described above. Typically, a cyclic redundancy check (CRC) code or a parity-check code may be used as the outer code.

The SCL decoding may be applied even when the outer code is concatenated with the polar code. However, operations such as $u_i$ bit determination method or decoding path cancellation using outer code may be added during decoding, depending on whether the CRC or parity check is used. Basically, however, the algorithm maintains L decoding paths that are the maximum number of paths and then performs an operation of selecting one decoding path ultimately among them.

Low Complexity SCL Decoding Method of Polar Codes

In decoding the most information bits, the conventional decoding algorithm performs an operation of sorting the reliability values of all paths in order to select L decoding paths having the highest reliability. Considering hardware implementation of the SCL decoding, the sorting complexity may take up a considerable percentage of the total decoding complexity depending on the value of list size L. In particular, using parallel sorting to reduce decoding latency, the sorting complexity takes up a larger percentage of the total complexity.

According to one embodiment of the present disclosure, the low complexity SCL decoding method for polar codes reduces the high complexity of decoding and maintains maximum error rate performance, thereby aiming at maximizing the practicality of SCL decoding. In particular, considering that the sorting complexity takes a large percentage of the total decoding complexity when using a non-small list size, the algorithm aims to simplify the sorting operation.

In this regard, the low complexity SCL decoding scheme of the polar code according to one embodiment of the present disclosure relates to an improved SCL decoding scheme in which via the reduction of the sorting complexity as mentioned above, it is possible to reduce the complexity of the polar code decoding and further reduce the decoding delay. In decoding $u_i$, the conventional SCL decoding determines whether the current bit is an information bit and then performs two different decoding operations based on the determination result. The low complexity SCL decoding method of the polar code according to one embodiment of the present disclosure defines a new set corresponding to a subset of information sets and performs a new decoding operation using the defined subset.

Figure 2:
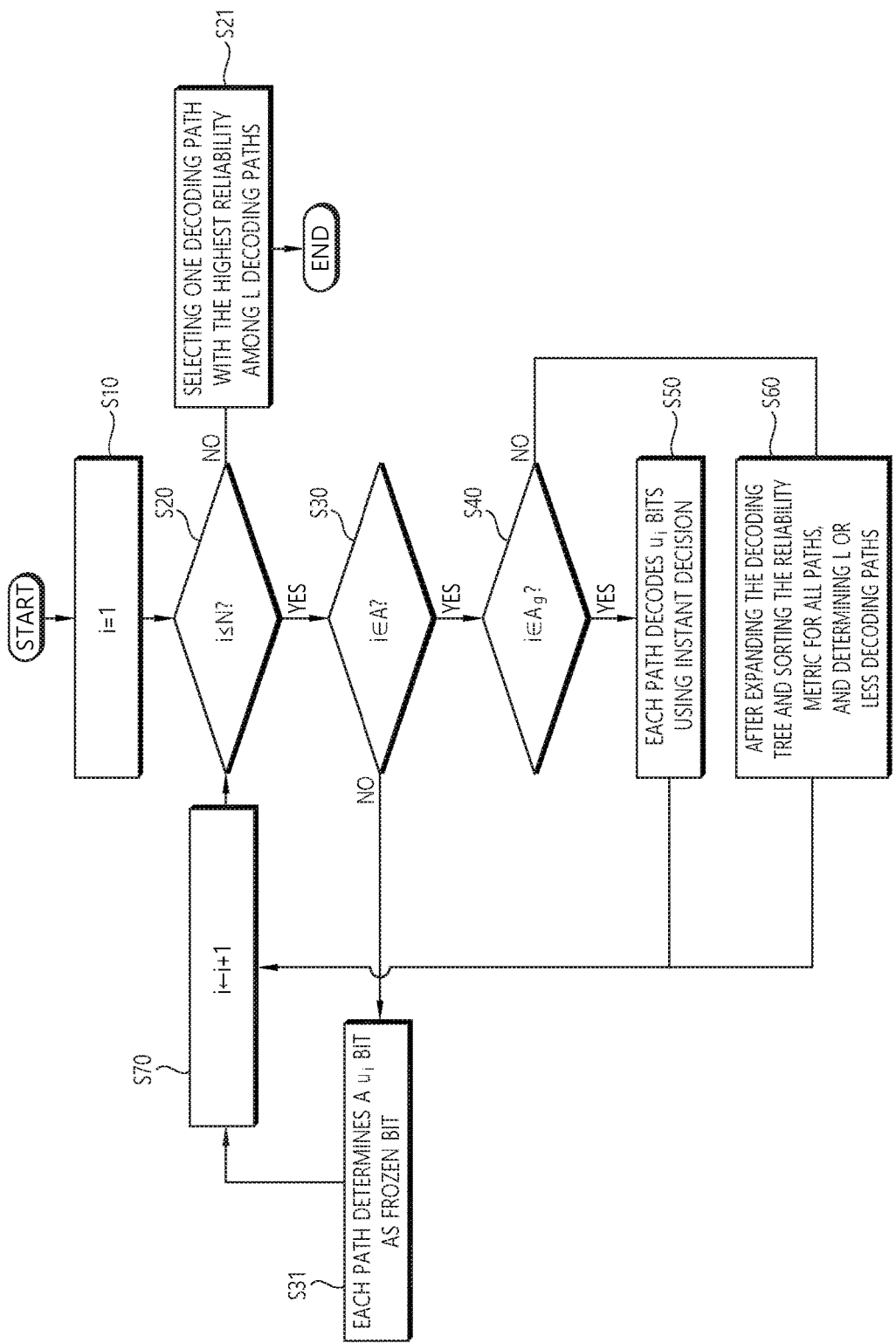
FIG. 2 shows the operation flowchart of the decoding scheme according to one embodiment of the present disclosure.

FIG. 2 shows the operation flowchart of the decoding scheme according to one embodiment of the present disclosure. As shown in FIG. 2, the low complexity SCL decoding scheme of the polar code according to one embodiment of the present disclosure defines a new set $A_g$ corresponding to a subset of the information set. The scheme may perform different decoding operations in connection with decoding $u_i$ bits belonging to three sets $A/A_g$ (set excluding $A_g$ from A), $A_g$ and $A^c$, respectively. As shown in FIG. 2, first, for $u_1$ bit decoding, the scheme sets i=1 (step S10). If i is not greater than the block length N of the source vector (step S20), this scheme performs decoding for each bit $u_i$ when i belongs to the set $A/A_g$ (see step S30, step S40 and step S60), and when i belongs to the set $A^c$ (see step S30 and step S31), the $u_i$ bit decoding operation is the same as the conventional SCL decoding operation. Further, in the decoding of $u_i$ bits belonging to the set $A_g$ (see step S30, step S40 and step S50), each decoding path may determine the bit value independently based on the reliability for the $u_i$ bit. This scheme may called an instant determination because this scheme does not perform the sorting operation performed in the conventional SCL decoding but instantly determines the corresponding bit. Performing the instant determination eliminates the need for sorting operations, thus reducing complexity. Further, the instant determination can reduce the number of clocks needed for sorting, thus reducing decoding latency, depending on the decoder implementation method. Moreover, when performing the instant determination, the number of decoding paths remains the same, even when the number of current decoding paths is less than L. Referring back to FIG. 2, once the processing of the current bit is completed, i has i+1 value (step S70). The scheme responds to the determination that all bits of the source vector have been processed based on the block lengths (step S20). In this response, the scheme selects one decoding path that has the highest reliability among the L number of decoding paths that have remained currently (step S21). As such, the scheme may complete decoding of multiple bits of the source vector.

In this connection, depending on the size and set configuration of the set $A_g$, performance degradation may occur. Thus, it is important that the size and set configuration of the set $A_g$ is properly selected. In this connection, the reference for the set $A_g$ determination is not limited to a particular reference, but for ease of explanation, in one embodiment, the reliability for each $u_i$ may serve as a reference. That is, among the $u_i$ bits belonging to the information set A, the scheme may be configured so that bits having the reliability of the upper 10% or 20% belong to the set $A_g$. In this way, when the set $A_g$ is selected using the reliability for $u_i$ as the determination reference, reduction of decoding complexity may be achieved while minimizing performance degradation.

Further, the size of the set $A_g$ may vary depending on the L value of the list decoder, the code parameter (block length, code rate, etc.) or the channel quality (received SNR, etc.). In the case where the L value is relatively large, when the block length is high, when the code rate is low, and/or when the channel quality is high, the size of the set $A_g$ may be set larger.

Figure 5:
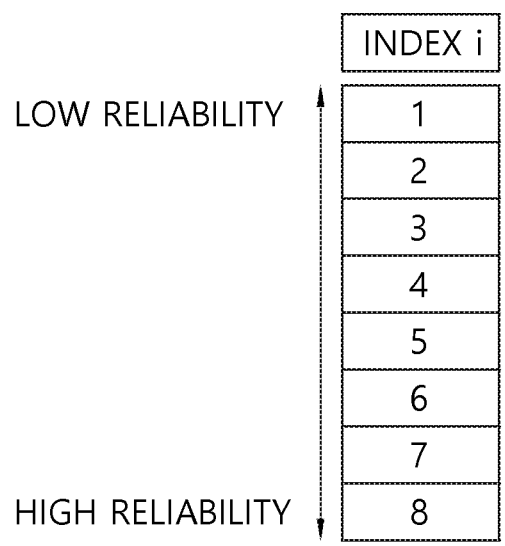
FIG. 5 is an illustrative drawing of the bit index sequence (N=8) sorted based on reliability degrees.

For example, FIG. 5 is an example figure (N=8) of a bit index sequence sorted based on the reliability. As shown in FIG. 5, the channel index sequence for N=8 is sorted using the reliability as a sorting reference. Considering A={4, 5, 6, 7, 8}, for L=8, the set $A_g$ may be set to be $A_g$={6, 7, 8}, that is, from the index with the high reliability. In the case of L=32, the set $A_g$ may be configured as $A_g$={4, 6, 7, 8}. For the other parameters mentioned above, in a similar manner to the example above, the $A_g$ may vary.

Meanwhile, even when the punctured bit is applied, the set $A_g$ may be selected in the same manner. In the example shown in FIG. 5, the index set of punctured bits is defined as P={4, 6, 8}. The information set may be selected for the remaining bit indices except for the set P. For example, the set A={2, 3, 5, 7}. When the set A is determined in this way, indexes having a higher reliability among the indexes belonging to the set A may preferentially belong to the set $A_g$. Based on the L value of the decoder, code parameter or channel quality, the size of the set $A_g$ may vary.

The SCL decoding scheme based on instant determination as described above may be applied to SCL-based decoding of polar codes such as CRC-concatenated polar codes or parity-check code concatenated polar codes as described above.

Figure 3:
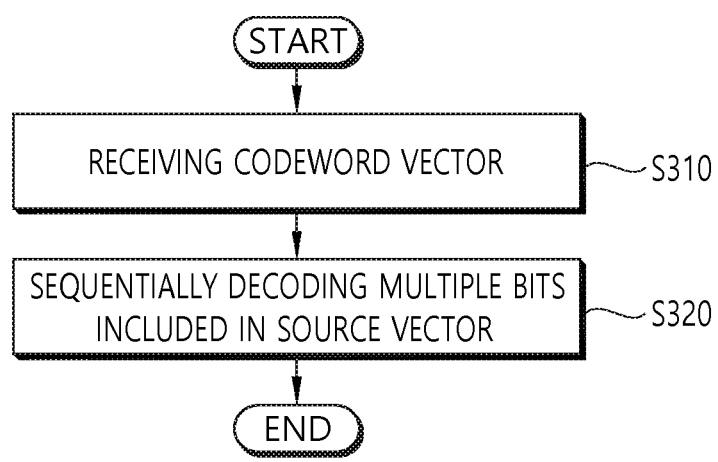
FIG. 3 is a flow chart of the low complexity SCL decoding method for the polar code according to one embodiment of the present disclosure.
Figure 4:
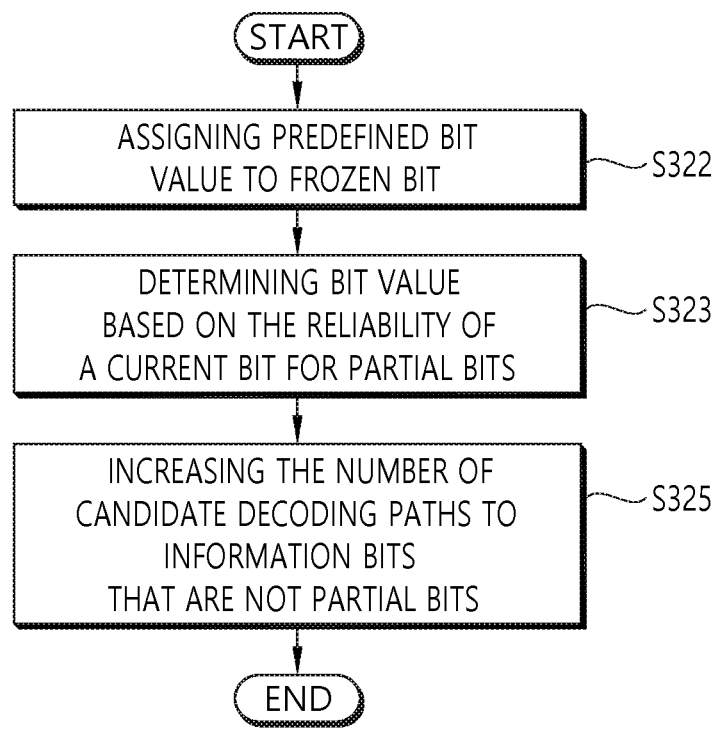
FIG. 4 is a detailed flowchart of the decoding operation of FIG. 3.

FIG. 3 is a flow chart of the low complexity SCL decoding method of the polar code according to one embodiment of the present disclosure. FIG. 4 is a detailed flowchart of the decoding step of FIG. 3. Referring to FIG. 3 and FIG. 4, the low complexity SCL decoding method of the polar code according to one embodiment of the present disclosure will be described in more detail.

As shown in FIG. 3, a low complexity SCL decoding method for a polar code according to one embodiment of the present disclosure may include, first, receiving a codeword vector generated using polar encoding (step S310). As described above, the codeword vector may be generated by binary multiplication between a source vector having a length of 1×N to be transmitted by the sender and an N×N sized polar encoding generator matrix, for example, as defined in Non-Patent Document 1. When the recipient receives the codeword vector transmitted by the sender, decoding of the polar code may be started.

Then, based on the successive cancellation list (SCL) decoding, multiple bits included in the source vector from the received codeword vector may be sequentially decoded (step S320). In this connection, in the decoding step, a comparison of reliability between candidate decoding paths is not performed for a subset of information bits corresponding to at least one bit among the information bits included in the source vector. Rather, based on the reliability of bits of the subset of information bits, the bit values of the subset of information bits may be determined. That is, an instant determination may be applied to determine the bit value. In case of conventional successive cancellation list decoding, when the number of candidate decoding paths exceeding the maximum path number L are generated, a reliability of each decoding path is calculated, the paths are sorted based on the level, and candidate decoding paths with low reliability are eliminated. However, in the low complexity SCL decoding method for polar codes according to one embodiment of the present disclosure, for a subset of information bits corresponding to at least one of multiple information bits, the value of the current bit in the subset is determined based only on the reliability of the current bit without any comparison between the reliability of the candidate decoding paths. This is very advantageous in terms of reduced decoding complexity.

More specifically, the source vector to be transmitted on the transmitting side includes information bits and frozen bits. The "subset of information bits for instant decision" (or instant decision set) according to one embodiment of the present disclosure represents a set of bits corresponding to indices belonging to a subset of the information set that is a set of indices corresponding to the information bits. That is, the subset of information bits for instant decision may be designated by selecting at least one of multiple information bits.

Referring to FIG. 4, in the decoding step (step S320), sequential processing for decoding may be performed for each of multiple bits included in a source vector. This sequential processing includes: i) a step (step S321) of maintaining the number of candidate decoding paths by assigning a predefined bit value (e.g., 0) to the current bit in response to a determination that the current bit is a frozen bit, ii) a step (step S323) of maintaining the number of candidate decoding paths by independently determining the value of the current bit by each candidate decoding path based on the reliability of the current bit in response to a determination that the current bit is in the subset of information bits (for example, the determined value may be a value with a high reliability from 0 or 1 in the current bit of each candidate decoding path); and/or iii) a step (step S325) of increasing the number of candidate decoding paths based on candidate values of the current bit in response to a determination that the current bit is an information bit not belonging to the subset of information bits for instant decision (For example, each candidate decoding path may be divided into a path whose current bit has a value of 0 and a path whose current bit has a value of 1). In this connection, the step (step S325) of increasing the number of candidate decoding paths based on candidate values of the current bit in response to a determination that the current bit is an information bit not belonging to the partial bits may further include a following operation: as in the conventional SCL decoding method, when the number of candidate decoding paths increased by the above processing exceeds the predetermined maximum number L of paths, in response to the determination, via sorting the candidate decoding paths based on respective reliability of the candidate decoding paths, for example, candidate decoding paths with lower reliability may be removed. As a result, a number of candidate decoding paths corresponding to a number equal to the increased number of candidate decoding paths minus the maximum number may be eliminated.

Meanwhile, in the decoding step (step S320), after processing of the final bit among multiple bits included in the source vector is completed, decoding of multiple bits included in the source vector may be completed by selecting a decoding path having the highest reliability among candidate decoding paths that have not yet been removed.

As mentioned above, the source vector may be a source vector to which at least one of cyclic redundancy check (CRC) code or parity-check code is applied in advance. This may further improve the error rate performance of the polar code. The low complexity SCL decoding method of the polar code may be applied even in the case of the encoding of the polar code with which the outer code such as the CRC code or the parity check code is concatenated. Operations such as $u_i$ bit determination method or decoding path removal using the outer code may be added into the middle of the decoding.

As described above, in terms of preventing excessive performance degradation, a configuration reference used for constituting the subset of information bits for instant decision may be important. For example, the subset of information bits for instant decision may be composed of bits which associated with subchannels with high reliability among the information bits, based on the subchannel quality or reliability of the information bits. More specifically, for example, a bit whose reliability of the corresponding bit is the upper 10% or 20% may be configured to belong to the subset of information bits for instant decision. In addition, the size of the sub-set may be configured based on at least one of the maximum path number, the block length, the code rate, and the channel quality. More specifically, the size of the sub-set may be in proportion to the maximum path number, the block length, and the channel quality, and may be inversely proportional to the code rate.

In addition, the source vector may further contain punctured bits. In the case where a punctured bit is applied, the information bit may be specified as bits other than punctured bits among multiple bits of the source vector.

Low Complexity SCL Decoding Device of Polar Code

Figure 6:
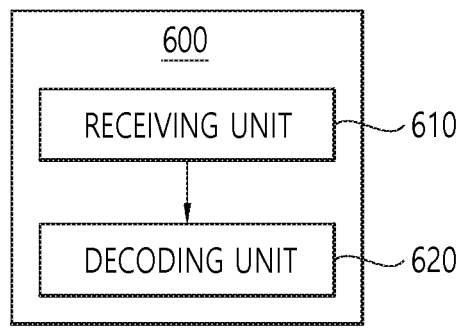
FIG. 6 is a block diagram showing the configuration of a low complexity SCL decoding device for polar codes according to one embodiment of the present disclosure.

FIG. 6 is a block diagram illustrating the configuration of a low complexity SCL decoding device of polar codes according to one embodiment of the present disclosure. As shown in FIG. 6, the low complexity SCL decoding device 600 of the polar code according to one embodiment of the present disclosure may include a receiving unit 610 and a decoding unit 620.

The receiving unit 610 may receive a codeword vector generated using polar encoding. The decoding unit 620 may sequentially decode multiple bits included in the source vector from the codeword vector based on a successive cancellation list (SCL) decoding. In this connection, the decoding unit 620 may be configured to perform the decoding step such that the comparison of reliability between candidate decoding paths is not performed for a subset of information bits corresponding to at least one bit among the information bits included in the source vector, and, rather, based on the reliability of bits of the subset of information bits, the bit values of the subset of information bits may be determined. That is, an instant determination may be applied to determine the bit value.

Meanwhile, more specific operations of the low complexity SCL decoding device 600 according to one embodiment of the present disclosure may be the same operations as described in the low complexity SCL decoding method of the polar code according to one embodiment of the present disclosure as described above.

The low complexity SCL decoding method of the polar code according to the present disclosure as described above may be implemented using computer readable codes stored in a computer readable recording medium. The computer-readable recording medium includes all kinds of recording media capable of storing data that may be interpreted by a computer system. For example, such a recording medium may include a ROM (Read Only Memory), a RAM (Random Access Memory), a magnetic tape, a magnetic disk, a flash memory, and an optical data storage device. In addition, the computer readable recording medium may be embodied in a distributed manner over a computer system connected over a computer network. In this connection, the codes that may be read in a distributed manner may be stored and executed in the medium.

Figure 7:
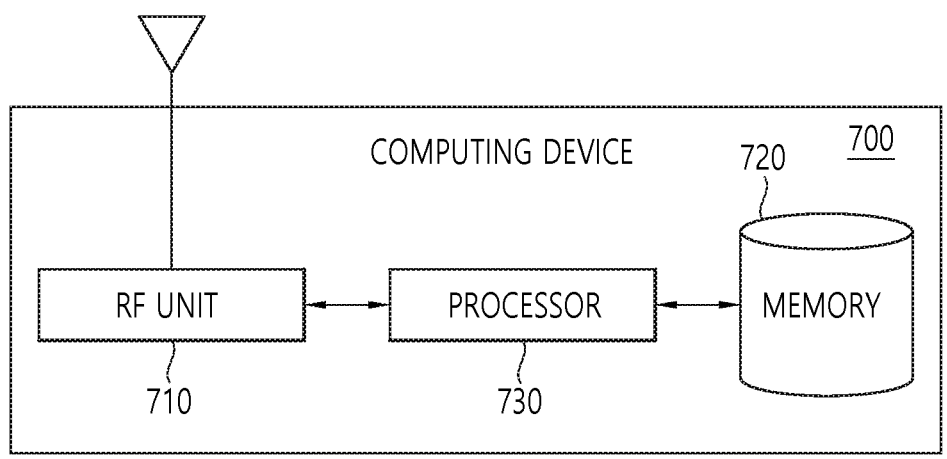
FIG. 7 is an illustration of a computing device for low complexity SCL decoding for polar codes according to one embodiment of the present disclosure.

FIG. 7 is an illustration of a computing device for low complexity SCL decoding of polar codes according to one embodiment of the present disclosure. As shown in FIG. 7, via instructions for low complexity SCL decoding of the polar code according to one embodiment of the present disclosure, the computing device 700 as shown in FIG. 7 may perform the low complexity SCL decoding of the polar codes.

More specifically, processor-executed instructions for low complexity SCL decoding of the polar code may be stored in memory 720, for example. When executed by the processor 730 included in the computing device 700, the instructions cause the processor 730 to perform the following operations: the processor 730 receives the codeword vector generated using polar encoding polar encoding via RF module 710; and the processor 730 sequentially decodes multiple bits included in the source vector from the codeword vector based on successive cancellation list (SCL) decoding.

In this connection, when the processor 730 performs the decoding, the instructions may be configured such that the processor performs the following operation: the processor 730 performs the decoding step such that the comparison of reliability between candidate decoding paths is not performed for a subset of information bits corresponding to at least one bit among the information bits included in the source vector, and, rather, based on the reliability of bits of the subset of information bits, the bit values of the subset of information bits may be determined. That is, an instant determination may be applied to determine the bit value.

Experimental Example

Figure 8:
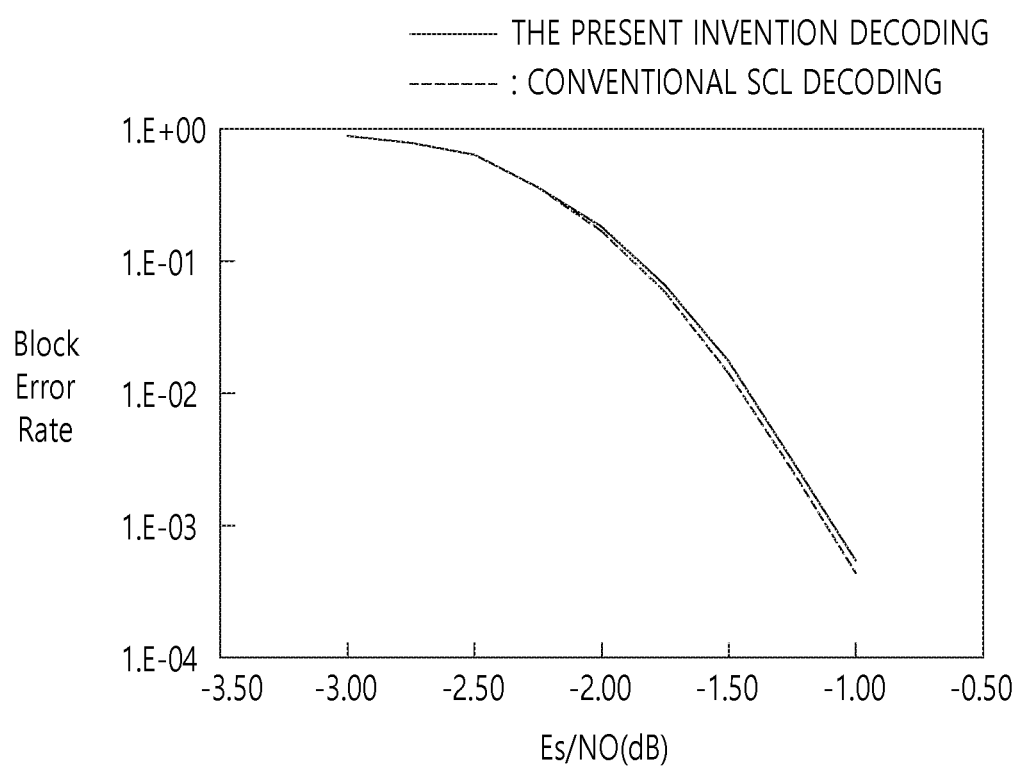
FIG. 8 shows the comparison between the error rate performances (N=1024, code rate 1/2) for the decoding scheme according to one embodiment of the present disclosure and for the conventional decoding scheme.

In order to verify the effectiveness of the inventive scheme, the results of comparison between error rate performance and complexity for conventional SCL decoding and decoding according to the present invention are presented. FIG. 8 shows a comparison (N=1024, code rate 1/2) between the error rate performances for the conventional decoding scheme and for decoding schemes according to one embodiment of the present disclosure. In this connection, the polar encoding method uses a CRC-concatenated polar encoding method as disclosed in Non-Patent Document 2 (I. Tal and A. Vardy, "List decoding of polar codes," IEEE Trans. Inf. Theory, vol. 61, no. 5, pp. 2213-2226, May 2015). As may be seen in FIG. 8, the low complexity SCL decoding scheme of the polar code according to one embodiment of the present disclosure has almost the same performance as the conventional scheme and may have performance degradation within about 0.03 dB. The complexities were compared based on the number of addition operations required for decoding. In the conventional scheme, about 625,500 addition operations are performed for one block decoding, while, in the low complexity SCL decoding scheme of the polar code according to one embodiment of the present disclosure, 359,300 addition operations were performed for one block decoding. Therefore, it is confirmed that the low complexity SCL decoding scheme of the polar code according to one embodiment of the present disclosure has a complexity of about 57% in comparison with the conventional scheme.

While the foregoing description of the present disclosure has been provided with reference to preferred embodiments of the present disclosure, those skilled in the art will appreciate that various modifications and changes may be made to the present disclosure without departing from the spirit and scope of the present disclosure set forth in the claims that follow.

What is claimed is:

1. A method of low complexity SCL decoding for polar codes, the method comprising:
receiving a codeword vector generated using polar encoding; and
sequentially decoding multiple bits included in a source vector from the received codeword vector based on the successive cancellation list (SCL) decoding,
wherein the decoding is configured not to perform a comparison of reliability between candidate decoding paths for a subset of information bits included in the source vector, but to determine a value of the subset of information bits based on a reliability of a corresponding bit, wherein the source vector includes the information bits and frozen bits, wherein the subset of information bits includes one or more bits corresponding to indexes belonging to a subset of an information set, which is a set of an indexes corresponding to the information bits.

2. The method of claim 1, wherein the decoding includes sequential processing of each of multiple bits included in the source vector, wherein the sequential processing includes one of:

maintaining a number of candidate decoding paths by assigning a predefined bit value to a current bit in response to a determination that the current bit is one of the frozen bits;

maintaining a number of candidate decoding paths via independently determining a value of the current bit by each candidate decoding path based on a reliability of the current bit in response to a determination that the current bit is in the subset of information bits; and increasing a number of candidate decoding paths according to candidate values of the current bit in response to a determination that the current bit is the information bit not belonging to the subset of information bits.

3. The method of claim 2, wherein the increasing a number of candidate decoding paths further comprises:

removing candidate decoding paths exceeding the maximum number of paths, in response to a determination that the increased number of candidate decoding paths exceeds a predetermined maximum number of paths, by sorting the candidate decoding paths based on a reliability of each of the candidate decoding paths.

4. The method of claim 2, wherein the decoding further comprises, after processing of a final bit among the multiple bits included in the source vector is completed, completing the decoding of the multiple bits included in the source vector by selecting a decoding path having a highest reliability among the candidate decoding paths.

5. The method of claim 3, wherein a size of the subset of information bits is configured based on at least one of the maximum number of the paths, a block length, a code rate, and a channel quality.

6. The method of claim 5, wherein the size of the subset of information bits is in proportion to the number of maximum paths, the block length, and the channel quality, and is inversely proportional to the code rate.

7. The method of claim 1, wherein the source vector is a source vector to which either one or both of a cyclic redundancy check (CRC) code and a parity-check code is pre-applied.

8. The method of claim 1, wherein the subset of information bits includes bits determined to have a predetermined high-ranked reliability among the information bits, based on the reliability of the information bits.

9. The method of claim 1, wherein the source vector further includes punctured bits, wherein the information bits are specified as bits other than the punctured bits among multiple bits of the source vector.

10. An apparatus of low complexity SCL decoding for polar codes, the apparatus comprising:

a receiving unit configured to receive a codeword vector generated using polar encoding; and a decoding unit configured to sequentially decode multiple bits included in a source vector from the received codeword vector based on the successive cancellation list (SCL) decoding, wherein the decoding unit is configured not to perform a comparison of reliability between candidate decoding paths for a subset of information bits included in the source vector, but to determine a value of the subset of an information set based on a reliability of a corresponding bit, wherein the source vector includes the information bits and frozen bits, wherein the subset of information bits includes one or more bits corresponding to indexes belonging to a subset of an information set, which is a set of an indexes corresponding to the information bits.

11. The apparatus of claim 10, wherein the decoding unit includes sequential processing of each of multiple bits included in the source vector, wherein the sequential processing is configured to perform one of:

maintaining a number of candidate decoding paths by assigning a predefined bit value to a current bit in response to a determination that the current bit is one of the frozen bits;

maintaining a number of candidate decoding paths via independently determining a value of the current bit by each candidate decoding path based on a reliability of the current bit in response to a determination that the current bit is in the subset of an information set; and increasing a number of candidate decoding paths according to candidate values of the current bit in response to a determination that the current bit is the information bit not belonging to the subset of an information set.

12. The apparatus of claim 11, wherein the increasing a number of candidate decoding paths further comprises:

removing candidate decoding paths exceeding the maximum number of paths, in response to a determination that the increased number of candidate decoding paths exceeds a predetermined maximum number of paths, by sorting the candidate decoding paths based on reliability of each of the candidate decoding paths.

13. The apparatus of claim 12, wherein a size of the partial bits is configured based on at least one of the maximum number of the paths, a block length, a code rate, and a channel quality.

14. The apparatus of claim 13, wherein the size of the subset of an information set is in proportion to the number of maximum paths, the block length, and the channel quality, and is inversely proportional to the code rate.

15. The apparatus of claim 11, wherein the decoding unit further comprises, after processing of a final bit among the multiple bits included in the source vector is completed, completing the decoding of the multiple bits included in the source vector by selecting a decoding path having a highest reliability among the candidate decoding paths.

16. The apparatus of claim 10, wherein the source vector is a source vector to which either one or both of a cyclic redundancy check (CRC) code and a parity-check code is pre-applied.

17. The apparatus of claim 10, wherein the subset of an information set includes bits determined to have a predetermined high-ranked reliability among the information bits, based on the reliability of the information bits.

18. The apparatus of claim 10, wherein the source vector further includes punctured bits, wherein the information bits are specified as bits other than the punctured bits among multiple bits of the source vector.

* * * * *